US012080686B2

United States Patent
Liao et al.

(10) Patent No.: US 12,080,686 B2
(45) Date of Patent: Sep. 3, 2024

(54) FLEXIBLE MICRO DEVICE DISPLAY PANEL

(71) Applicant: PLAYNITRIDE DISPLAY CO., LTD., Miaoli County (TW)

(72) Inventors: Kuan-Yung Liao, Miaoli County (TW); Ying-Tsang Liu, Miaoli County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 833 days.

(21) Appl. No.: 17/136,029

(22) Filed: Dec. 29, 2020

(65) Prior Publication Data
US 2021/0383729 A1 Dec. 9, 2021

(30) Foreign Application Priority Data
Jun. 3, 2020 (TW) .................................. 109118534

(51) Int. Cl.
*H01L 25/075* (2006.01)
*H01L 33/62* (2010.01)

(52) U.S. Cl.
CPC .......... *H01L 25/0753* (2013.01); *H01L 33/62* (2013.01)

(58) Field of Classification Search
CPC .... H01L 25/0753; H01L 33/62; H01L 25/167
See application file for complete search history.

(56) References Cited

U.S. PATENT DOCUMENTS

| 2014/0015135 A1* | 1/2014 | Rieger .............. H01L 21/76897 438/675 |
|---|---|---|
| 2018/0212015 A1 | 7/2018 | Chen |
| 2019/0273124 A1* | 9/2019 | Leng .................... H10K 77/111 |

(Continued)

FOREIGN PATENT DOCUMENTS

| CN | 108922877 | 11/2018 |
|---|---|---|
| CN | 109148487 | 1/2019 |
| CN | 109148541 | 1/2019 |

(Continued)

OTHER PUBLICATIONS

"Office Action of China Counterpart Application", issued on Jan. 5, 2023, p. 1-p. 9.

(Continued)

*Primary Examiner* — Ratisha Mehta
(74) *Attorney, Agent, or Firm* — JCIPRNET (57) ABSTRACT

The present invention discloses a flexible micro device display panel which comprises a substrate, a plurality of micro light emitting units, a first trace line, and a backup conductive line. The substrate comprises a display region having a bending area and a non-bending area. The plurality of micro light emitting units are disposed on the substrate within the display region. The first trace line is arranged from the non-bending area to the bending area. The backup conductive line is disposed at a second metal layer and coupled with the first trace line. The first metal layer and the second metal layer are disposed on the substrate, and the distance between the substrate and the first metal layer is different from the distance between the substrate and the second metal layer. The backup conductive line is not disposed within the non-bending area.

7 Claims, 11 Drawing Sheets

(56) References Cited

U.S. PATENT DOCUMENTS

2020/0135640 A1* 4/2020 Sio .................... H01L 23/5286
2020/0310180 A1* 10/2020 Fu ..................... G02F 1/13439

FOREIGN PATENT DOCUMENTS

| | | | | |
|---|---|---|---|---|
| CN | 110600509 | | 12/2019 | |
| CN | 111048563 | | 4/2020 | |
| CN | 111048566 | | 4/2020 | |
| CN | 111063257 | | 4/2020 | |
| CN | 111063257 A | * | 4/2020 | ............. G09F 9/301 |
| WO | 2020073434 | | 4/2020 | |

OTHER PUBLICATIONS

"Office Action of China Counterpart Application", issued on Jul. 13, 2023, p. 1-p. 9.

* cited by examiner

FLEXIBLE MICRO DEVICE DISPLAY PANEL

CROSS REFERENCE TO RELATED APPLICATION

The present application claims priority to Taiwan patent application Serial No. 109118534 filed on Jun. 3, 2020, the entire content of which is incorporated by reference to this application.

BACKGROUND OF THE INVENTION

1. Field of the Invention

The present invention pertains to a substrate and a display panel, in particular to a flexible micro device display panel including a bending area.

2. Description of the Prior Art

With the advancement of semiconductor technology, display panels are no longer limited to planar structures. More and more displayers and electronic products on the market are beginning to use curved or foldable flexible micro device display panels. However, bending the flexible micro device display panel may damage the internal structure of the flexible micro device display panel. For example, trace lines disposed in a bending area may be broken due to bending stress. In practice, a broken trace line means that a transmission path of various display signals is cut off, which will cause abnormalities around the bending area or the entire display screen. In addition, the broken trace line can also reduce the yield of the flexible micro device display panel. Accordingly, the industry needs a new flexible micro device display panel, which can reduce the risk of the transmission path being cut off in the bending area, thereby improving the yield of the flexible micro device display panel.

SUMMARY OF THE INVENTION

The present invention provides a flexible micro device display panel, which has a backup conductive line in a bending area thereof. The backup conductive line can provide another signal transmission path to reduce signal transmission issues in the bending area.

The present invention discloses a flexible micro device display panel which comprises a substrate, a plurality of micro light emitting units, a first trace line, and a backup conductive line. The substrate comprises a display region having a bending area and a non-bending area. The plurality of micro light emitting units are disposed on the substrate within the display region. The first trace line, disposed at a first metal layer, is arranged in the display region and passing through the bending area. The backup conductive line is disposed at a second metal layer and electrically connected with the first trace line. The first metal layer and the second metal layer are disposed on the substrate, and the distance between the substrate and the first metal layer is different from the distance between the substrate and the second metal layer. The backup conductive line is not disposed within the non-bending area. The first trace line is electrically connected with the backup conductive line through a conductive via, the conductive via contacts the first metal layer and the second metal layer respectively, and the conductive via is located within the bending area.

In some embodiments, the flexible micro device display panel may further comprise the substrate, the first metal layer and the second metal layer may be stacked on the substrate, a first end of the conductive via away from the substrate has a first cross-sectional area, and a second end of the conductive via near the substrate has a second cross-sectional area, the first cross-sectional area is greater than the second cross-sectional area. In addition, a light emitting surface may be further defined, and the projection of the backup conductive line overlaps the projection of the first trace line in a normal direction of the light emitting surface.

In some embodiments, the flexible micro device display panel may further comprise an element structure disposed on the substrate, the element structure comprises a circuit layer and a light emitting element layer. The circuit layer may comprise the first trace line and the backup conductive line, and the light emitting element layer may comprise the plurality of micro light emitting units. The circuit layer may be electrically connected the light emitting element layer to control the plurality of micro light emitting units to emit light. Besides, the circuit layer is disposed on the substrate and the light emitting element layer is disposed on the circuit layer. The flexible micro device display panel may further comprise a third metal layer, designed as another backup conductive line, is electrically connected with the first trace line within the bending area. In addition, the first trace line may transmit a first signal, the first signal has two transmission paths in the bending area, and the first signal has one transmission path in the non-bending area. The first signal may have a first signal transmission path and a second signal transmission path in the bending area, the first signal transmission path is defined as that the first signal is transmitted along the first trace line, and the second signal transmission path is defined as that the first signal is transmitted along the first trace line, the backup conductive line, and then return to the first trace line.

The present invention provides a flexible micro device display panel, which has a backup conductive line in a bending area thereof. The backup conductive line can provide another signal transmission path to reduce signal transmission issues in the bending area.

The present invention discloses a flexible micro device display panel which comprises a substrate and a first trace line. The substrate comprises a display region having a bending area and a non-bending area. The first trace line transmits a first signal. The first signal is electrically connected with a first signal transmission path and a second signal transmission path in the bending area. The first signal transmission path passes through a first metal layer, and the second signal transmission path passes through a second metal layer.

In some embodiments, the first signal may be connected with one transmission path in the non-bending area. A conductive via may be disposed within the bending area, the conductive via is electrically connected with the first metal layer and the second metal layer. A third signal transmission path may be located in the bending area, and the third signal transmission path passes through the first metal layer and the second metal layer. When the first trace line damaged at bending area, the first signal can be transmitted along the second signal transmission path.

To summarize, the invention provides a flexible micro device display panel has a designed layout of trace lines. For example, the trace lines of the present invention can be electrically connected with multiple metal layers in the bending area for transmitting signals. Since the trace lines may not be designed in the same metal layer, even if one of the metal layers breaks in the bending area, it will not cause signal transmission issues in the bending area.

DETAILED DESCRIPTION OF THE INVENTION

The features, objectives, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1A:
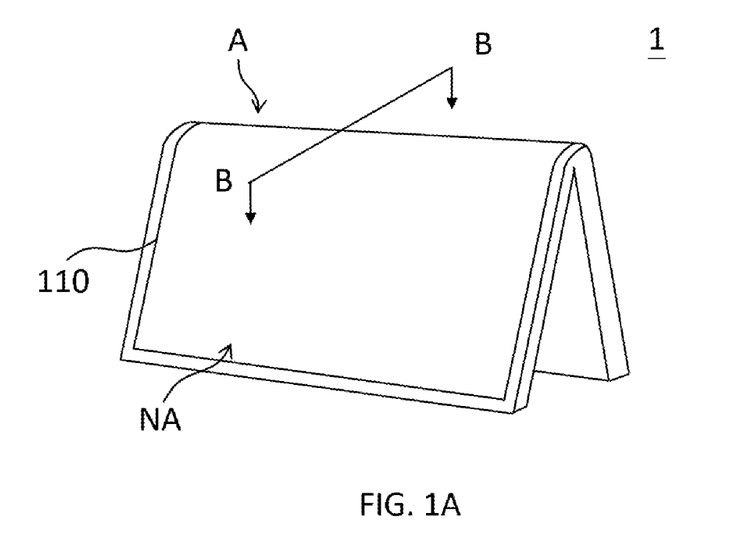
FIG. 1A is a perspective view of a flexible micro device display panel in accordance with an embodiment of the present invention.
Figure 1B:
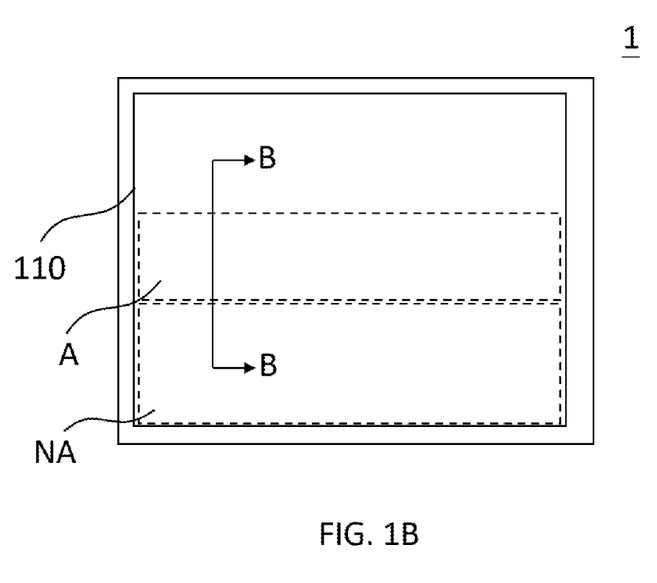
FIG. 1B is a top view of a flexible micro device display panel in accordance with an embodiment of the present invention.
Figure 1C:
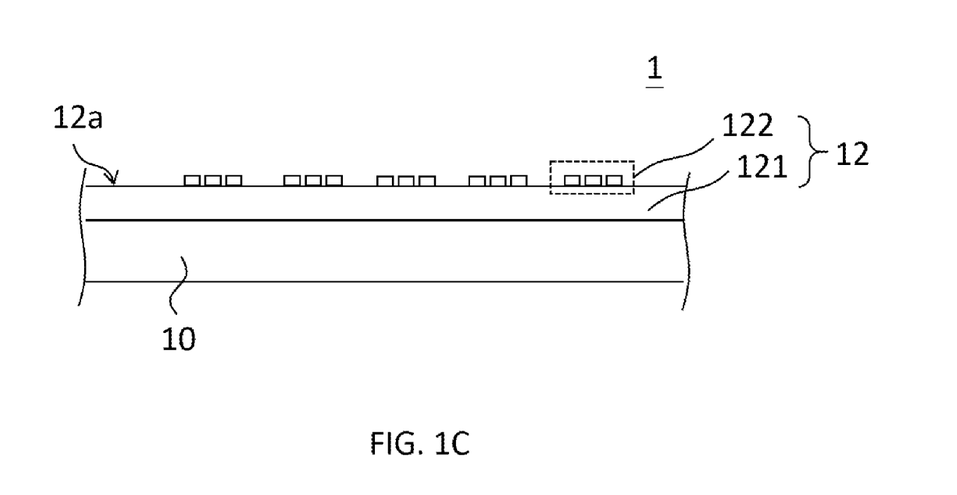
FIG. 1C is a side view of a flexible micro device display panel in accordance with an embodiment of the present invention.

Please refer to FIG. 1A, FIG. 1B, and FIG. 1C together. FIG. 1A is a perspective view of a flexible micro device display panel in accordance with an embodiment of the present invention. FIG. 1B is a top view of a flexible micro device display panel in accordance with an embodiment of the present invention. FIG. 1C is a side view of a flexible micro device display panel in accordance with an embodiment of the present invention. As shown in the figures, the flexible micro device display panel 1 disclosed in this embodiment can be used to display images, and the flexible micro device display panel 1 can comprise a display region 110 for displaying images. The display region 110 can have a bending area A and a non-bending area NA. Here, the bending area A in this embodiment may be an area of the flexible micro device display panel 1 with a fixed curvature. For example, the bending area A may correspond to a curved edge of a screen of a mobile phone or a tablet computer. Taking the example of FIG. 1A, the bending area A of the flexible micro device display panel 1 can also be an area without a fixed curvature that the bending area A may be bent between 0 degrees and 180 degrees. For example, the bending area A may correspond to a folded portion of a screen of a foldable mobile phone or tablet computer. In other words, this embodiment is not used to limit the curvature of the bending area A, nor to limit the relative position of the bending area A in the flexible micro device display panel 1. Moreover, the non-bending area NA of this embodiment may be an area of the flexible micro device display panel 1 that cannot be bent (e.g. substantially planar). This embodiment does not specifically indicate the location of the non-bending area NA position. In practice, the area outside the bending area A can be regarded as the non-bending area NA.

In addition, the flexible micro device display panel 1 may include a substrate 10 and an element structure 12, and the element structure 12 is disposed on one side of the substrate 10. In one example, the element structure 12 includes a circuit layer 121 and a light emitting element layer 122. The top surface of the element structure 12 opposite to the substrate 10 is a light emitting surface 12a. The circuit layer 121 is provided with a plurality of stacked metal layers as trace lines for transmitting signals. Here, the circuit layer 121 may, but not limit to, include active elements such as complementary metal-oxide semiconductor (CMOS), thin film transistor (TFT), or passive elements such as capacitors. The light emitting element layer 122 includes a plurality of micro light emitting units. The plurality of micro light emitting units can be active components for emitting light, for example, vertical or flip-chip type micro light emitting diodes, or organic light emitting diodes. In this embodiment, micro light emitting diodes are used, and each pixel includes the micro light emitting diodes having red, green, and blue colors, respectively. In addition, the element structure 12 may also have other micro devices in some embodiments, including micro integrated circuits, micro laser diodes, and micro sensing devices. Moreover, the substrate 10 may be a glass carrier board, a sapphire carrier board, a silicon carrier board, or an alumina carrier board (e.g. $Al_2O_3$), and the plurality of micro light emitting units may also be disposed on the substrate 10 by mass transferring.

Figure 1D:
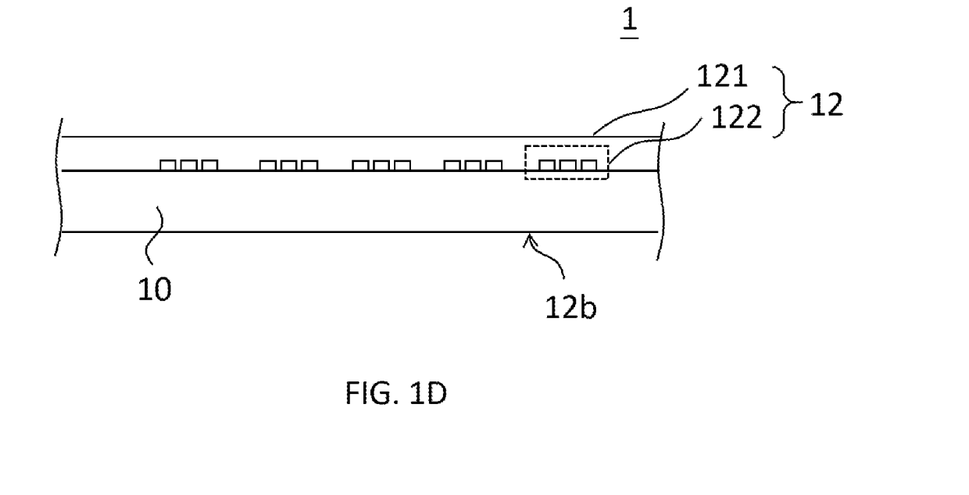
FIG. 1D is a side view of a flexible micro device display panel in accordance with another embodiment of the present invention.

Besides, although the embodiment of FIG. 1C defines the top surface of the element structure 12 opposite to the substrate 10 (e.g. top portion of FIG. 1C) as the light emitting surface 12a, the present invention is not limited to the example of FIG. 1C. Please refer to FIG. 1D, FIG. 1D is a side view of a flexible micro device display panel in accordance with another embodiment of the present invention. The same as the embodiment shown in FIG. 1C, the flexible micro device display panel 1 of FIG. 1D may also include a substrate 10 and an element structure 12, and the element structure 12 is disposed on one side of the substrate 10. In addition, the element structure 12 may include the circuit layer 121 and the light emitting element layer 122. The circuit layer 121 may also be provided with a plurality of stacked metal layers as trace lines for transmitting signals, and the light emitting element layer 122 may also include a plurality of micro light emitting units. In one example, the light emitting element layer 122 is electrically connected with the circuit layer 121, and signals (e.g. driving signals) can be transmitted to the light emitting element layer 122 through the circuit layer 121, so that the plurality of micro light emitting units in the light emitting element layer 122 can be driven and controlled to emit light and to display the image. However, the embodiment shown in FIG. 1C, the stacked position of the light emitting element layer 122 and the circuit layer 121 of FIG. 1D are different from the embodiment shown in FIG. 1C, the light emitting element layer 122 is closer to the substrate 10, and the circuit layer 121 is stacked thereon so that the light emitting element layer 122 is substantially between the substrate 10 and the circuit layer 121. Furthermore, the light emitting direction of the plurality of micro light emitting units in the light emitting element layer 122 is toward the substrate 10 in FIG. 1D, which is different from FIG. 1C. The light emitting surface 12a shown in FIG. 1C is on the upper side of the flexible micro device display panel 1, and the light emitting surface 12b shown in 1D is on the lower side of the flexible micro device display panel 1.

Figure 2:
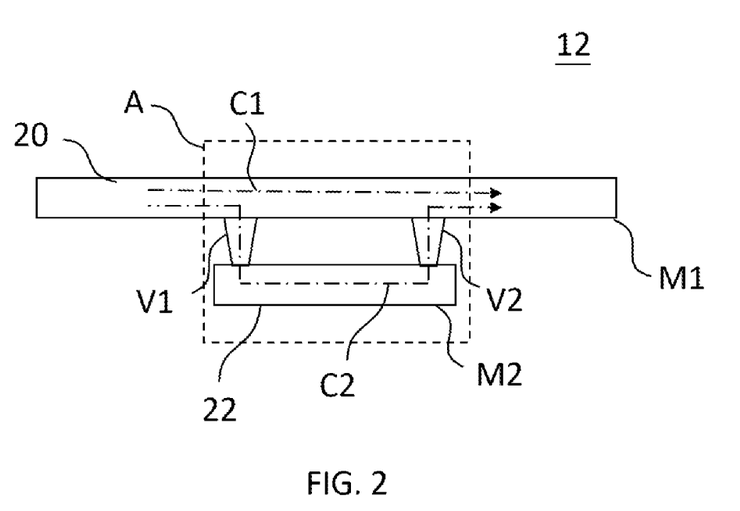
FIG. 2 is a schematic diagram of an element structure in accordance with an embodiment of the present invention.

In order to explain the element structure 12 in the bending area A of the flexible micro device display panel 1, please refer to FIG. 1A, FIG. 1B and FIG. 2 together. FIG. 2 is a schematic diagram of an element structure in accordance with an embodiment of the present invention. In detail, FIG. 2 illustrates the internal structure of a part of the element structure 12, and FIG. 2 can be regarded as a cross-sectional view of FIG. 1B along line BB. The element structure 12 of FIG. 2 can have, but not limit to, multiple metal layers (e.g. a first metal layer M1 and a second metal layer M2) and a plurality of conductive vias (e.g. the conductive via V1 and the conductive via V2). For example, apart from multiple metal layers and conductive vias, there may have spacer materials, insulating materials, or functional elements filled between the metal layers. For simplicity of the drawing, the element structure 12 of FIG. 2 focuses on the metal layers and the conductive vias in the circuit layer 121 in FIG. 1C, other components will not be specifically marked in FIG. 2.

Although FIG. 2 only shows the first metal layer M1 and the second metal layer M2, this embodiment does not limit the number of metal layers. The element structure 12 may also include more stacked metal layers. In one example, the first metal layer M1 and the second metal layer M2 are stacked in the element structure 12, and the element structure 12 is directly disposed on the substrate 10. In order to reduce the effect of parasitic capacitance, the conductive vias V1 and V2 may be non-cylindrical. For example, the ends of the conductive vias V1 and V2 away from the substrate 10 may be thicker, and the ends close to the substrate 10 are thinner. In an embodiment, assuming that the relative position of the substrate 10 is below FIG. 2, the first metal layer M1 is relatively far away from the substrate 10 and the second metal layer M2 is relatively close to the substrate 10. At this time, the cross-sectional area (first cross-sectional area) of the conductive via V1 and the conductive via V2 contacting the first metal layer M1 is larger than the cross-sectional area (second cross-sectional area) contacting the second metal layer M2.

Of course, this embodiment does not limit the number and shape of the conductive vias in FIG. 2, and does not limit the relative positions of the conductive vias and the respective metal layers. Moreover, this embodiment also does not limit the materials of the first metal layer M1, the second metal layer M2, the conductive via V1, and the conductive via V2. In an embodiment, the first metal layer M1, the second metal layer M2, the conductive via V1, and the conductive via V2 can be made of materials with high conductivity, such as aluminum, aluminum alloy, or silicide metal, and can use metals with high ductility, such as gold, silver, platinum, nickel, copper, aluminum, zinc, etc. Noted that this embodiment does not limit the first metal layer M1 to be adjacent to the second metal layer M2. For example, there may be other metal layers between the first metal layer M1 and the second metal layer M2.

As shown in FIG. 2, part of the first metal layer M1 may be designed as a first trace line 20 to transfer a specified signal (first signal), e.g. display data or driving signal. And, part of the second metal layer M2 can be designed as a backup conductive line 22 in the bending area A, the backup conductive line 22 is electrically connected to the first trace line 20, and can also be used to transmit a specified signal (said first signal). In an example, assuming that the specified signal is to be transmitted from the left side to the right side of the bending area A, this embodiment may define the transmission path of the signal along the first trace line 20 (the first metal layer M1) as the signal transmission path C1 (first signal transmission path). And, the transmission path starts from the first metal layer M1, passes through the conductive via V1, the backup conductive line 22 (the second metal layer M2), the conductive via V2, and then returns to the first metal layer M1 can be defined as a signal transmission path C2 (second signal transmission path). In other words, the first signal shown in FIG. 2 is transmitted in the first metal layer M1 before entering the bending area A (for example, the non-bending area NA on the left side of the bending area A). In the bending area A, the first signal may be transmitted in the first metal layer M1 and the second metal layer M2 at the same time. After leaving the bending area A (for example, the non-bending area NA on the right side of the bending area A), the first signal continues to be transmitted in the first metal layer M1.

It can be seen from FIG. 2 that the backup conductive line 22 of this embodiment is only disposed in the bending area A, but not in the non-bending area NA. In other words, in the bending area A, the first signal may have two transmission paths, e.g. both the first signal transmission path and the second signal transmission path. In the non-bending area NA, the first signal has only one transmission path, e.g. the first signal transmission path. Unlike the traditional display panel that uses only single metal layer to transmit one signal in the bending area A, the first signal of this embodiment may have multiple signal transmission paths in multiple metal layers at the same time in the bending area A, so that the flexible micro device display panel can maintain its function when particular metal layer or signal transmission path is broken or damaged.

Figure 3:
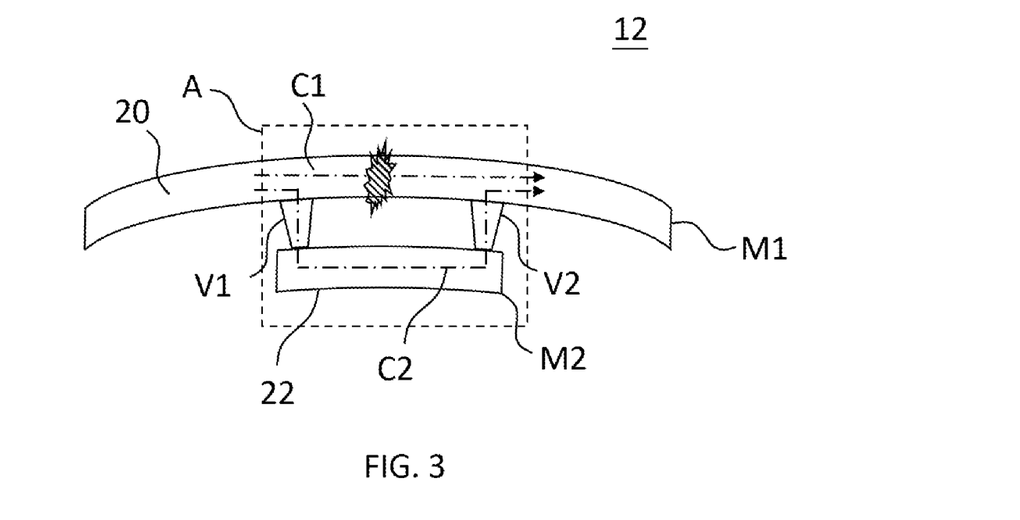
FIG. 3 is a schematic diagram of an element structure with a broken circuit layer in accordance with an embodiment of the present invention.

In one example, when the element structure 12 in the bending area A is bent, the bending area A is subject to greater stress. FIG. 3 assumes that the first metal layer M1 in the circuit layer is broken, which is a schematic diagram of an element structure with a broken circuit layer in accordance with an embodiment of the present invention. As shown in the figure, the first metal layer M1 can be damaged by stress. Since the first signal can be transmitted in both the first metal layer M1 and the second metal layer M2 at the same time in the bending area A, and the first signal can still be transmitted via the signal transmission path C2 when the signal transmission path C1 is disconnected. It can be seen that the traditional flexible micro device display panel has no backup trace line in the bending area, and still transmits signals through a single metal layer. Once the metal layer of the traditional flexible micro device display panel breaks, it will directly cause the abnormality of a display screen. In contrast, in the flexible micro device display panel 1 of this embodiment, multiple metal layers can be used to transmit one signal in the bending area, so that the problems of the display screen can be reduced.

Although this embodiment does not limit the relative position between the first trace line 20 and the backup conductive line 22, it should be understood that since the first trace line 20 and the backup conductive line 22 are arranged in different metal layers, the first trace line 20 and the backup conductive line 22 may be spaced apart in the vertical direction (for example, the up-down direction in FIG. 2). In one example, the first trace line 20 may be just above the backup conductive line 22 in the normal direction of the light emitting surface 12a of FIG. 1B. In other words, the projection of the backup conductive line 22 will partially or completely overlap the projection of the first trace line 20 in the normal direction of the light emitting surface 12a. Noted that this embodiment is not limited to FIG. 2 which shows the conductive via V1 and the conductive via V2 in the bending area A. For example, the conductive via V1 and the conductive via V2 may be both, or one of them, outside of the bending area A. Those of ordinary skill in the art should understand that as long as there are more than two signal transmission paths in the bending area A, and more than two signal transmission paths are located in different metal layers, the risk of abnormal display due to broken metal layer can be reduced.

Figure 4:
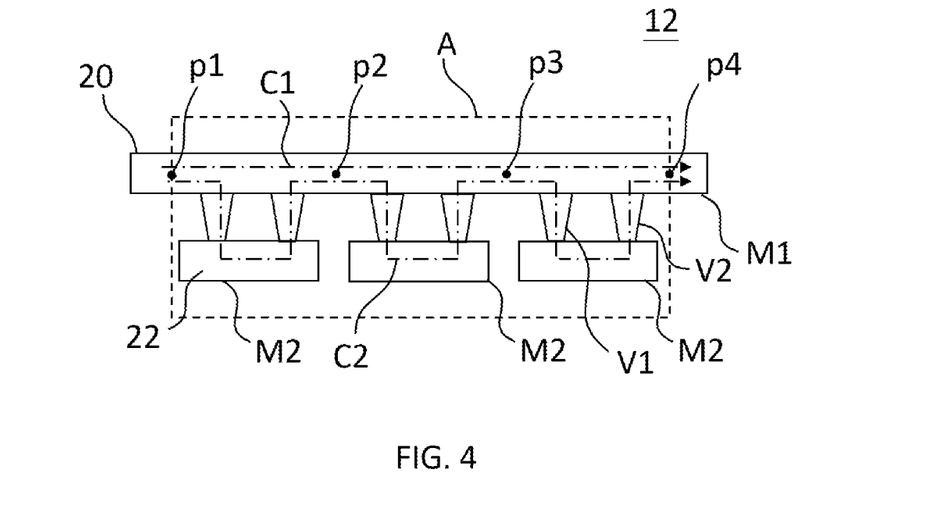
FIG. 4 is a schematic diagram of an element structure in accordance with another embodiment of the present invention.

In addition, although FIG. 2 illustrates that the signal transmission path C2 passes through the backup conductive line 22 in the second metal layer M2 once, the number of backup conductive line 22 is not limited in this embodiment. Please refer to FIG. 4, FIG. 4 is a schematic diagram of an element structure in accordance with another embodiment of the present invention. As shown in FIG. 4, more than two backup conductive lines 22 may be included in the bending area A, so that the signal transmission path C2 may also repeatedly pass through the first metal layer M1 and the second metal layer M2 multiple times. The same as the embodiment of FIG. 2, when the first trace line 20 in the first metal layer M1 is damaged, the backup conductive line 22 in the second metal layer M2 can also provide a backup transmission path (signal transmission path C2). In practice, the embodiment of FIG. 4 can be regarded as a multi-stage backup conductive line 22. For example, the backup conductive lines 22 can be disposed between nodes p1 to p2, nodes p2 to p3, and nodes p3 to p4. The backup conductive line 22 in the embodiment of FIG. 2 is longer, the backup conductive line 22 in FIG. 4 is shorter and can reduce the risk of the backup conductive line 22 being damaged at the same time. For example, even if the backup conductive line 22 between the nodes p1 to p2 is broken, it can still work normally since the backup conductive lines 22 between the nodes p2 to p3 and p3 to p4 are not affected, which helps to further reduce the risk of abnormal display.

Figure 5:
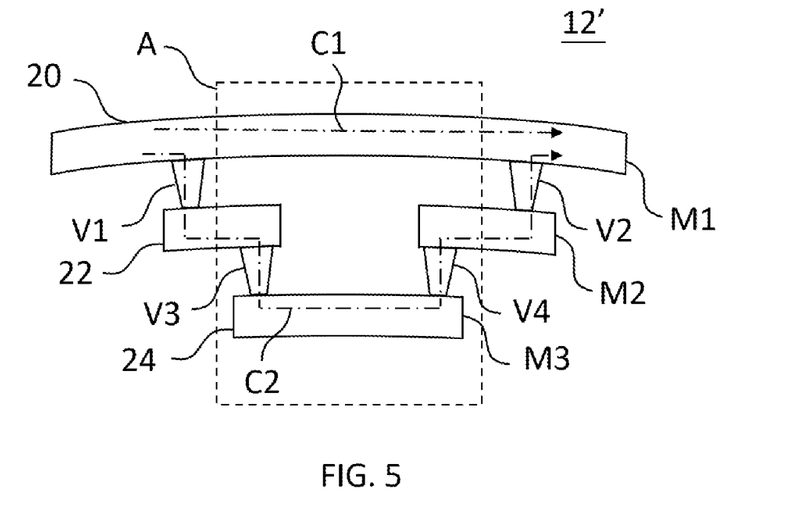
FIG. 5 is a schematic diagram of an element structure in accordance with another embodiment of the present invention.

Please refer to FIG. 2 and FIG. 5 together, FIG. 5 is a schematic diagram of an element structure in accordance with another embodiment of the present invention. As in FIG. 2, the element structure 12' in FIG. 5 also has a first metal layer M1, a second metal layer M2, a conductive via V1, and a conductive via V2. Part of the first metal layer M1 can be designed as the first trace line 20, and part of the second metal layer M2 may be designed as the backup conductive line 22. In addition, the signal can also be transferred via the first trace line 20, and the transmission path along the first metal layer M1 can be defined as the signal transmission path C1.

The difference between FIG. 2 and FIG. 5 is that the conductive via V1 and the conductive via V2 of the element structure 12' are disposed outside the bending area A, and the element structure 12' further has a third metal layer M3, the conductive via V3 and the conductive via V4. Part of the third metal layer M3 can be designed as another backup conductive line 24. A transmission path that the signal flows through the backup conductive line 22 (the second metal layer M2) to the third metal layer M3 in the bending area A may be defined as a signal transmission path C2. As can be seen from FIG. 5, this embodiment does not limit whether the conductive via V1 and the conductive via V2 are in the bending area A. Even if the conductive via V1 and the conductive via V2 are not in the bending area A, the signal transmission path C2 can still transmit signals as long as at least part of the backup conductive line 22 is in the bending area A. In addition, this embodiment also demonstrates that there can be multiple different signal transmission paths in the bending area A. Those of ordinary skill in the art should understand that as long as not all signal transmission paths are cut off, the flexible micro device display panel can still display normally. Compared to FIG. 2, since the third metal layer M3 in FIG. 5 is further away from the first metal layer M1, it should be able to further reduce the electrical interference between the metals of different layers.

Figure 6A:
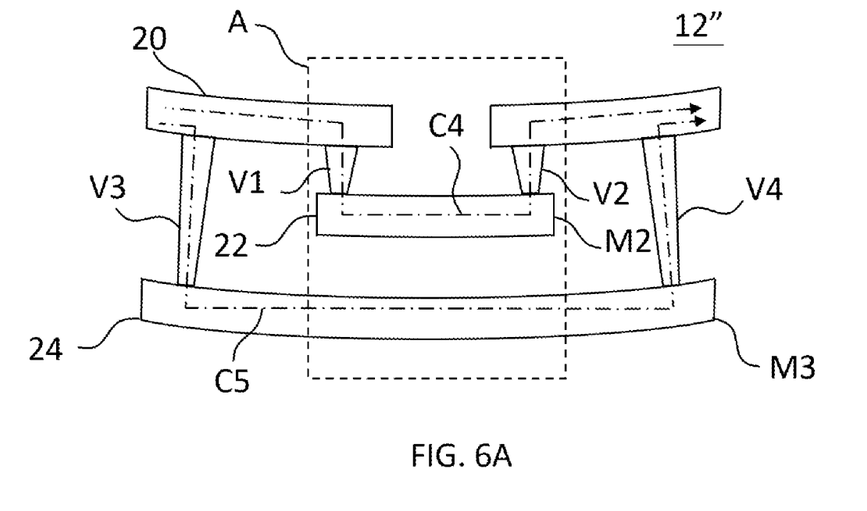
FIG. 6A is a schematic diagram of an element structure in accordance with another embodiment of the present invention.

Please refer to FIG. 5 and FIG. 6A together, FIG. 6A is a schematic diagram of an element structure in accordance with another embodiment of the present invention. As in FIG. 5, the element structure 12" in FIG. 6 also has a first metal layer M1, a second metal layer M2, a third metal layer M3, a conductive via V1, a conductive via V2, a conductive via V3, and a conductive via V4. Besides, part of the first metal layer M1 can be designed as the first trace line 20, part of the second metal layer M2 can be designed as the backup conductive line 22, part of the third metal layer M3 can be designed as another backup conductive line 24.

In contrast, the bending direction corresponding to the element structure 12" may be different from FIG. 5, and the first trace line 20 may be segmented in the first metal layer M1. The first metal layer M1 may be connected to the third metal layer M3 through the conductive via V3 and the conductive via V4. In one example, it is assumed that the relative position of the substrate 10 is below FIG. 6A, that is, the third metal layer M3, the second metal layer M2, and the first metal layer M1 are sequentially stacked on the substrate 10. When the substrate 10 is recessed on both sides in the bending area A, the first metal layer M1 is relatively far away from the substrate 10 and will bear a greater stress. At this time, due to the first trace line 20 is segmented in the first metal layer M1, and it should be able to disperse the stress of the first trace line 20 in the bending area A and avoid breakage in it. In one example, the first trace line 20 can be divided into more segments in the first metal layer M1, and the number of segments is not limited in this embodiment. In addition, as can be seen from FIG. 5, since the segmented first trace line 20 is still connected to the backup conductive line 22, so the first trace line 20 is still able to transmit signals, and the signal transmission path C4 (fourth signal transmission path) in the bending area A can pass through the first metal layer M1 and the second metal layer M2. Moreover, the signal transmission path C5 (fifth signal transmission path) in the bending area A can pass through the backup conductive line 24 in the third metal layer M3, because the third metal layer M3 is relatively close to the substrate 10 and the stress is relatively small. It can be understood that the backup conductive line 24 is less susceptible to stress damage and can ensure that the display remains normal.

Figure 6B:
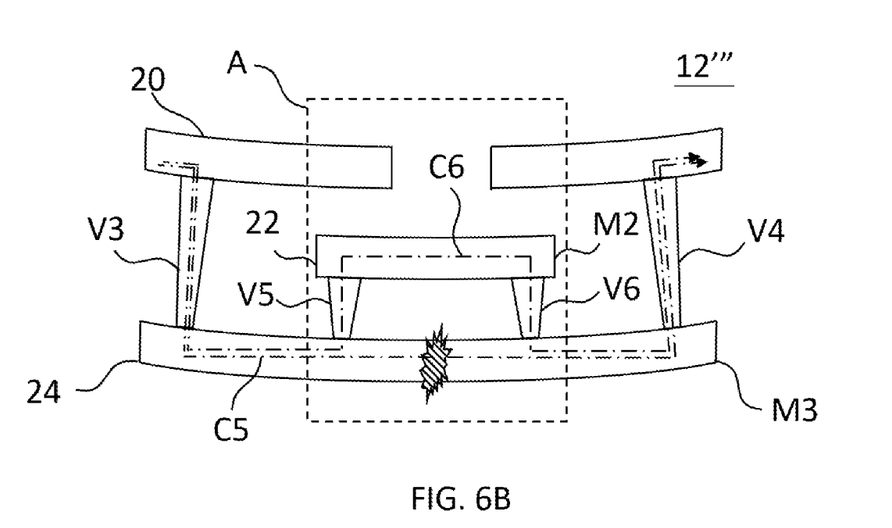
FIG. 6B is a schematic diagram of an element structure with a broken circuit layer in accordance with another embodiment of the present invention.

Please refer to FIG. 6B, FIG. 6B is a schematic diagram of an element structure with a broken circuit layer in accordance with another embodiment of the present invention. FIG. 6B is a schematic diagram of another implementation of the element structure 12" of the embodiment of FIG. 6A. The element structure 12''' of FIG. 6B is different from the element structure 12" of FIG. 6A in the connection of conductive vias. The conductive vias V5 and V6 are provided between the backup conductive line 22 (second metal layer M2) and the backup conductive line 24 (third metal layer M3). It is assumed that the relative position of the substrate 10 is below FIG. 6B, that is, the substrate 10, the third metal layer M3, the second metal layer M2, and the first metal layer M1 are sequentially stacked. When the substrate 10 is recessed on both sides in the bending area A, the third metal layer M3 might break at the place having the maximum curvature (e.g. center of the backup conductive line 24). Although the backup conductive line 24 is damaged in FIG. 6B, the first trace line 20 can still transmit signals through the signal transmission path C6 (sixth signal transmission path) to ensure that the display remains normal.

Figure 7:
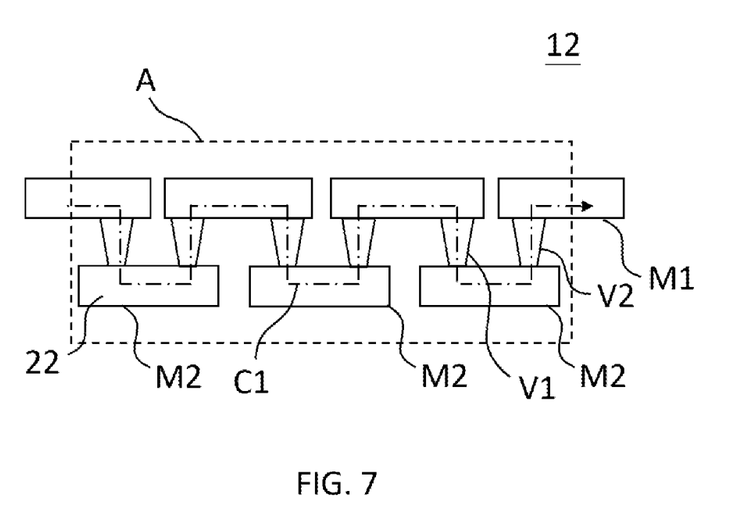
FIG. 7 is a schematic diagram of an element structure in accordance with another embodiment of the present invention.

On the other hand, please refer to FIG. 4 and FIG. 7 together. FIG. 7 is a schematic diagram of an element structure in accordance with another embodiment of the present invention. In the embodiment of FIG. 4, the length of each backup conductive line 22 is shortened to reduce the risk of breaking. In the embodiment of FIG. 7, the first trace line 20 (the first metal layer M1) can be divided into multiple short segments in the bending area A. Because both of the first trace line 20 and the backup conductive line 22 are connected in shorten segments, the signal transmission path C1 is hard to break during bending. Although the longer the length of the first trace line 20 and the backup conductive line 22 would have greater risk of breakage while bending, but the short first trace line 20 and the backup conductive line 22 would also have greater interference and distortion in signal transmission. In practice, the length of each segment of the first trace line 20 and the backup conductive line 22 may be, but not limit to, the same. Preferably, the length of each segment of the first trace line 20 and the backup conductive line 22 is less than $0.1*\pi R$. R is the radius of curvature when the bending area A is fully bent or folded. For example, assuming the radius of curvature R is 1.5 mm, the segment length of the first trace line 20 and the backup conductive line 22 is less than 470 um. Preferably, the segment length should not be shorter than the pixel length in flexible micro device display panel.

To summarize, the flexible micro device display panel provided by the present invention is designed with one or more backup conductive lines in the bending area. Since the trace lines may not be designed in the same metal layer, even if one of the metal layers breaks in the bending area, it will not cause signal transmission issues in the bending area.

What is claimed is:

1. A flexible micro device display panel, comprising:
a substrate comprising a display region having a bending area and a non-bending area;
a plurality of micro light emitting units disposed on the substrate and within the display region;
a first metal layer, separated into a first segment and a second segment, wherein both of the first segment and the second segment comprise a first part and a second part, wherein the first part is located within in the non-bending area and the second part is located within the bending area;
a second metal layer, wherein the second metal layer is located on one side of the first metal layer and within the bending area;
a third metal layer, wherein the third metal layer is disposed on the substrate and located on one side of the second metal layer away from the first metal layer, the third metal layer comprises a third part and a fourth part, and the third part is located within the non-bending region and the fourth part is located within the bending area;
a first conductive via, located within the bending area and electrically connected with the second metal layer and the third metal layer;
a second conductive via, located within the bending area and electrically connected with the second metal layer and the third metal layer;
a third conductive via, located within the non-bending area and electrically connected with the first segment of first metal layer and the third metal layer; and
a fourth conductive via, located within non-bending area and electrically connected with the second segment of first metal layer and the third metal layer,
wherein a distance between the substrate and the second metal layer is less than a distance between the substrate and the first metal layer,
wherein the first metal layer and the second metal layer are disposed on the substrate.

2. The flexible micro device display panel according to claim 1, wherein the first metal layer and the second metal layer are stacked on the substrate, a first end of the first conductive via away from the substrate has a first cross-sectional area, and a second end of the first conductive via near the substrate has a second cross-sectional area, the first cross-sectional area is greater than the second cross-sectional area.

3. The flexible micro device display panel according to claim 1, wherein a light emitting surface is further defined, and the projection of the the second metal layer partially overlaps the projection of the first metal layer in a normal direction of the light emitting surface.

4. The flexible micro device display panel according to claim 1, further comprises a light emitting element layer, wherein the light emitting element layer comprises the plurality of micro light emitting units, and the first metal layer, the second metal layer, and third metal layer are electrically connected to the light emitting element layer to control the plurality of micro light emitting units to emit light.

5. The flexible micro device display panel according to claim 1, wherein the first metal layer transmits a first signal, the first signal has two transmission paths in the bending area, and the first signal has one transmission path in the non-bending area.

6. The flexible micro device display panel according to claim 5, wherein the first signal has a first signal transmission path and a second signal transmission path in the bending area, the first signal transmission path is defined as that the first signal is transmitted along the second metal layer, and the second signal transmission path is defined as that the first signal is transmitted along the third metal layer.

7. The flexible micro device display panel according to claim 5,
wherein the first signal is electrically connected with a first signal transmission path and a second signal transmission path in the bending area, the first signal transmission path passes through a second metal layer, and the second signal transmission path passes through a third metal layer.

* * * * *